(12) United States Patent  (10) Patent No.: US 8,488,657 B2
Wu et al.  (45) Date of Patent: Jul. 16, 2013

(54) DATA INTERFACE WITH DELAY LOCKED LOOP FOR HIGH SPEED DIGITAL TO ANALOG CONVERTERS AND ANALOG TO DIGITAL CONVERTERS

(75) Inventors: Miaochen Wu, Acton, MA (US); Brian L. Dellacroce, Colorado Springs, CO (US)

(73) Assignee: Maxim Integrated Products, Inc., San Jose, CA (US)

( * ) Notice: Subject to any disclaimer, the term of this patent is extended or adjusted under 35 U.S.C. 154(b) by 402 days.

(21) Appl. No.: 12/794,152

(22) Filed: Jun. 4, 2010

(65) Prior Publication Data

US 2011/0298508 A1  Dec. 8, 2011

(51) Int. Cl.
*H04L 5/16* (2006.01)
(52) U.S. Cl.
USPC .......................................... 375/220; 375/322
(58) Field of Classification Search
USPC .......................................................... 375/322
See application file for complete search history.

(56) References Cited

U.S. PATENT DOCUMENTS

| | | | | |
|---|---|---|---|---|
| 6,321,282 B1 * | 11/2001 | Horowitz et al. | ............ | 710/104 |
| 6,765,424 B2 * | 7/2004 | Zampetti et al. | ............ | 327/292 |
| 6,795,076 B2 * | 9/2004 | Deering et al. | ............ | 345/502 |
| 6,943,609 B2 * | 9/2005 | Zampetti et al. | ............ | 327/292 |
| 7,315,269 B2 * | 1/2008 | Schreier et al. | ............ | 341/143 |
| 7,425,858 B1 * | 9/2008 | Daga | ............ | 327/279 |
| 7,590,207 B1 * | 9/2009 | Shumarayev et al. | ........ | 375/354 |
| 7,622,969 B2 * | 11/2009 | Johnson | ............ | 327/158 |
| 7,639,090 B2 * | 12/2009 | Lin | ............ | 331/25 |
| 7,715,471 B2 * | 5/2010 | Werner et al. | ............ | 375/232 |
| 7,860,203 B1 * | 12/2010 | Shumarayev et al. | ........ | 375/354 |
| 2002/0061087 A1 * | 5/2002 | Williams | ............ | 375/376 |
| 2002/0154718 A1 * | 10/2002 | Fong et al. | ............ | 375/354 |
| 2002/0184581 A1 * | 12/2002 | Komatsu | ............ | 714/724 |
| 2003/0094982 A1 * | 5/2003 | Zampetti et al. | ............ | 327/159 |
| 2004/0095838 A1 * | 5/2004 | Li | ............ | 365/233 |
| 2004/0164782 A1 * | 8/2004 | Zampetti et al. | ............ | 327/292 |
| 2004/0252804 A1 * | 12/2004 | Aoyama | ............ | 375/376 |
| 2005/0017810 A1 * | 1/2005 | Lin | ............ | 331/25 |
| 2005/0099967 A1 * | 5/2005 | Baba | ............ | 370/286 |
| 2005/0140537 A1 * | 6/2005 | Waltari | ............ | 341/162 |
| 2005/0169417 A1 * | 8/2005 | Amirichimeh et al. | ........ | 375/371 |
| 2005/0259764 A1 * | 11/2005 | Hung Lai et al. | ............ | 375/317 |
| 2007/0109030 A1 * | 5/2007 | Park | ............ | 327/156 |
| 2007/0146038 A1 * | 6/2007 | Werner et al. | ............ | 327/291 |
| 2007/0152766 A1 * | 7/2007 | Herrin et al. | ............ | 331/1 A |
| 2007/0279112 A1 * | 12/2007 | Maeda et al. | ............ | 327/158 |
| 2008/0303568 A1 * | 12/2008 | Werner et al. | ............ | 327/158 |

(Continued)

OTHER PUBLICATIONS

Application Note 989—Multiply Your Sampling Rate with Time-Interleaved Data Converters; Maxim Integrated Products, Inc.; Mar. 1, 2001; 6 pages.

*Primary Examiner* — Daniel Washburn
*Assistant Examiner* — Santiago Garcia

(57) ABSTRACT

A system comprises a first circuit includes a data transmitter circuit that transmits digital data based on a first clock signal. A sync generator outputs a sync signal based on the first clock signal. A digital to analog converter circuit includes a data receiver circuit that latches the digital data based on a second clock signal. A digital to analog converter core receives an output of the data receiver circuit. A delay locked loop circuit determines a delay based on the second clock signal and the sync signal and outputs the first clock signal to the first circuit based on the second clock signal and the delay.

20 Claims, 9 Drawing Sheets

U.S. PATENT DOCUMENTS

| | | | |
|---|---|---|---|
| 2009/0079485 A1* | 3/2009 | Lin | 327/161 |
| 2009/0146705 A1* | 6/2009 | Huang | 327/158 |
| 2009/0309652 A1* | 12/2009 | Kranabenter | 329/347 |
| 2010/0102868 A1* | 4/2010 | Kim et al. | 327/291 |
| 2010/0228514 A1* | 9/2010 | Ong et al. | 702/106 |
| 2011/0142112 A1* | 6/2011 | Lin et al. | 375/224 |
| 2011/0267898 A1* | 11/2011 | Yun et al. | 365/189.05 |
| 2011/0289245 A1* | 11/2011 | Horowitz et al. | 710/104 |
| 2012/0155586 A1* | 6/2012 | Felder et al. | 375/355 |

\* cited by examiner

DATA INTERFACE WITH DELAY LOCKED LOOP FOR HIGH SPEED DIGITAL TO ANALOG CONVERTERS AND ANALOG TO DIGITAL CONVERTERS

FIELD

The present disclosure relates to interfaces, and more particularly to a data interface with a delay locked loop for digital to analog converters and analog to digital converters.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A digital to analog converter (DAC) converts digital data into an analog signal. When operating at high speeds, the digital data received by the DAC typically needs to meet various timing requirements. For example only, the system needs to account for timing variations in the DAC that occur due to variations in process, supply voltage and temperature (PVT). The system also needs to account for timing variations that occur in a circuit such as a field programmable gate array (FPGA) or application specific integrated circuit (ASIC) that generates the digital data. Meeting the timing requirements ensures that a data latch clock of the DAC can reliably latch the digital data and achieve a desired dynamic performance.

A data interface between the FPGA or ASIC and the DAC becomes more difficult to implement as the speed of the DAC increases. For example only, one DAC implementation operates at 4 Giga samples per second (Gsps). A 4-to-1 multiplexer may be used at an input of the DAC, which reduces a digital data rate to 1 Gbps. In this application, there is only a 1 nanosecond (ns) time slot for the data interface for each bit of the digital data in a 16 bit digital data bus.

Several conventional implementations of the data interface will be described below in conjunction with FIGS. 1-5. Referring now to FIGS. 1 and 2, a system 20 includes a circuit 24 such as a FPGA, ASIC or other circuit that generates digital data. The circuit 24 may include a serializer circuit 30 that outputs digital data to a DAC 28 via a buffer 34. The DAC 28 includes a multiplexer 42 that receives the digital data and a clock data signal (CLK_data). The multiplexer 42 may be a 4:1 multiplexer. An output of the multiplexer 42 is transmitted to a DAC core 44. The DAC 28 further includes a clock divider circuit 48 that receives a DAC clock (CLK_dac) signal. The clock divider circuit 48 may divide the CLK_dac signal by a divisor. An output of the clock divider circuit 48 supplies the CLK_data signal to an input of the multiplexer 42 and a buffer 52. The buffer 52 outputs a data clock (DATACLK) signal to a buffer 56 of the circuit 24. The buffer 56 transmits the DATACLK signal to the serializer circuit 30.

The DATACLK signal after the buffer 52 is virtually identical to the CLK_data signal inside the DAC 28. The DATACLK signal is used as a synchronization clock in the circuit 24. The DATACLK signal ensures that the DAC 28 and the circuit 24 are frequency synchronized. Synchronizing a phase between the digital data and the CLK_data signal of the DAC 28 becomes an issue when the DAC conversion speed increases, which leaves less time for the CLK_data signal to latch the incoming digital data.

DATACLK jitter, digital data jitter, data to clock setup time and hold time, data line to data line skew, temperature changes, semiconductor manufacturing process variations, and/or power supply variations also tend to reduce timing margin and tend to collapse a valid data window shown in FIG. 2 at relatively high data rates.

Referring now to FIG. 3, another data interface approach is shown. A system 60 includes a circuit 62 such as a FPGA, ASIC or other circuit. The circuit 62 may include a serializer circuit 68 that outputs digital data to a DAC 64 via a buffer 70. The DAC 64 includes a first in first out (FIFO) memory circuit 72 that receives the digital data, a CLK_fifo signal at a Clk_in input and a CLK_data signal at a Clk_out input. An output of the FIFO memory circuit 72 is output to a multiplexer 74. An output of the multiplexer 74 is transmitted to a DAC core 76.

The DAC 64 further includes a clock divider circuit 80 that receives a DAC clock (CLK_dac) signal. An output of the clock divider circuit 80 supplies the CLK_data signal to the multiplexer 74 and the FIFO circuit 72. A buffer 82 communicates with the clock divider circuit 80 and outputs a data clock (DATACLK) signal to a buffer 84 of the circuit 62. The buffer 84 transmits the DATACLK signal to the serializer circuit 68 and to a buffer 88, which generates and outputs the CLK_fifo signal to the FIFO memory circuit 72.

In this approach, the DATACLK signal generated by the DAC 64 is sent to the circuit 62 for data clocking and synchronization. A version of the DATACLK signal from the buffer 88 (the CLK_fifo signal) is transmitted back to the DAC 64 along with the digital data. The CLK_fifo signal latches the incoming digital data into the FIFO memory circuit 72. The digital data in the FIFO memory circuit 72 is clocked out by the CLK_data signal.

With enough FIFO depth, synchronization occurs between the two clock domains (CLK_fifo and CLK_data). While this approach can be implemented fully digitally and design synthesis tools may be used, the system 60 tends to consume relatively high power and generates digital noise and spurs in frequency spectrum that reduce DAC dynamic performance. In addition, this implementation requires large chip area, which increases cost.

Referring now to FIGS. 4 and 5, a system 100 includes a circuit 102 such as a FPGA, ASIC or other circuit. The circuit 102 may include a first serializer circuit 106 that outputs digital data to a DAC 104 via a buffer 108. The DAC 104 includes a multiplexer 112 that receives a clock data (CLK_data) signal and digital data. An output of the multiplexer 112 is transmitted to a DAC core 114. The DAC 104 further includes a clock divider circuit 116 that receives a DAC clock (CLK_dac) signal. An output of the clock divider circuit 116 supplies the CLK_data signal to the multiplexer 112 and a buffer 118.

The buffer 118 outputs a data clock (DATACLK) signal (via a conductor having a length L) to a buffer 120 of the circuit 102. The buffer 120 transmits the DATACLK signal to a first input of a digital clock management (DCM) circuit 122. An output of the DCM circuit 122 is output to first and second clock inputs of a second serializer circuit 124. An output of the second serializer circuit 124 is input to a delay circuit 126, which outputs a DCLK signal to a buffer 130. A second buffer 132 receives an output of the buffer 130. The second buffer 132 outputs the DCLK signal to a clock feedback input of the DCM circuit 122.

In use, the DATACLK signal generated by the DAC 104 is transmitted to the circuit 102 as a synchronization clock to clock out the digital data. The DATACLK signal is also used as a reference clock signal for DCM circuit 122 associated with the circuit 102. A conductor 150 that routes DCLK between the buffers 130 and 132 has a length (M+L). This length matches a sum of a length M of a conductor carrying the digital data from the buffer 108 to the multiplexer 112 and the length L of the conductor carrying the DATACLK signal from the buffer 118 to the buffer 120. For example, the conductor 150 can be a trace on a printed circuit board (PCB).

There is a fixed phase relationship between the CLK_data signal and the DATACLK signal as can be seen in FIG. 5, subject to PVT-induced delay changes of the output buffer. The length (L+M) of the conductor 150 can be made such that the DCLK signal is placed optimally for the required timing between the DCLK signal and the digital data for a given PVT case. Because the DCLK signal is locked by a delay locked loop inside the circuit 102, the DCLK signal has the same phase as the DATACLK signal with matched conductor lengths.

A phase relationship between the CLK_data signal and the digital data is fixed and optimized for a given PVT case. However, the optimal timing point may change with PVT changes due to the output buffer 118 inside the DAC 104, which may reduce the timing margin in the data interface.

In general, the DCM circuit 122 inside the circuit 102 has relatively large jitter. The output lines of the circuit 102 also tend to have relatively large skew. As a result, this approach tends to suffer reduced timing margin because of the jitter and skew. In addition, this approach may require manual tuning of the length M+L of the conductor 150 to obtain the proper timing.

SUMMARY

A system comprises a first circuit includes a data transmitter circuit that transmits digital data based on a first clock signal. A sync generator outputs a sync signal based on the first clock signal. A digital to analog converter circuit includes a data receiver circuit that latches the digital data based on a second clock signal. A digital to analog converter core receives an output of the data receiver circuit. A delay locked loop circuit determines a delay based on the second clock signal and the sync signal and outputs the first clock signal to the first circuit based on the second clock signal and the delay.

In other features, a clock divider receives a third clock signal and that outputs the second clock signal. The delay locked loop circuit comprises an in-phase/quadrature (I/Q) clock generator that receives the second clock signal and that generates I and Q signals. A phase detector receives the sync signal and the second clock signal and generates up and down signals. A loop filter receives the up and down signals. The sync signal comprises a pseudo random bit. A phase interpolator generates a fourth clock signal based on the I and Q signals and an output of the loop filter. A clock divider receives the fourth clock signal and outputs the first clock signal.

In other features, a linear phase detector receives the sync signal and the second clock. A charge pump communicates with an output of the linear phase detector. A filter receives an output of the charge pump. The sync signal comprises a periodic signal. A voltage controlled delay line generates a fourth clock signal based on the second clock and an output of the filter. A clock divider receives the fourth clock signal and outputs the first clock signal.

In other features, the first circuit is implemented as a first integrated circuit and the receiver circuit is implemented as a second integrated circuit. The first integrated circuit and the second integrated circuit are mounted on a printed circuit board in a spaced relationship and connected by traces.

In other features, the first circuit comprises one of an Application Specific Integrated Circuit (ASIC) and a Field Programmable Gate Array (FPGA). The data transmitter circuit comprises a serializer and the data receiver circuit comprises a multiplexer.

A system includes a transmitter circuit. The transmitter circuit includes a data transmitter circuit that outputs digital data based on a first clock signal. A sync generator outputs a sync signal based on the first clock signal. A receiver circuit includes a data receiver circuit that latches the digital data based on a second clock signal. The receiver includes a delay locked loop circuit that determines a delay based on a phase difference between the second clock signal and the sync signal and that outputs the first clock signal to the first circuit based on the second clock signal and the delay.

A method includes outputting digital data from a first circuit based on a first clock signal; outputting a sync signal from the first circuit based on the first clock signal; latching the digital data at a second circuit based on a second clock signal; using a delay locked loop to determine a delay at the second circuit based on a phase difference between the second clock signal and the sync signal; and outputting the first clock signal from the second circuit to the first circuit based on the second clock signal and the delay.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figures 1, 2:
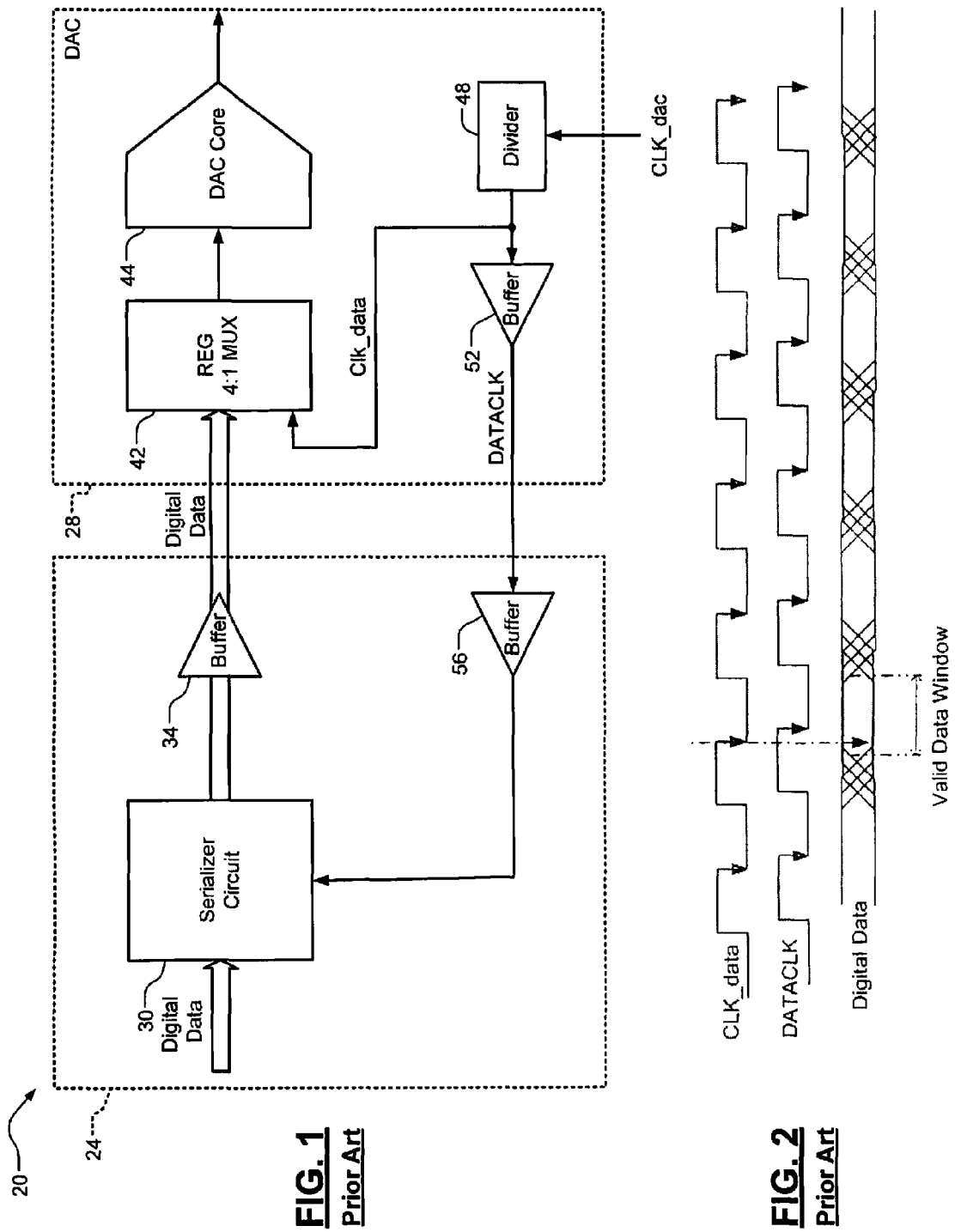
FIG. 1 is a functional block diagram of an exemplary data interface for a digital to analog converter according to the prior art.
FIG. 2 illustrates timing of clock signals for the circuit of FIG. 1.
Figure 3:
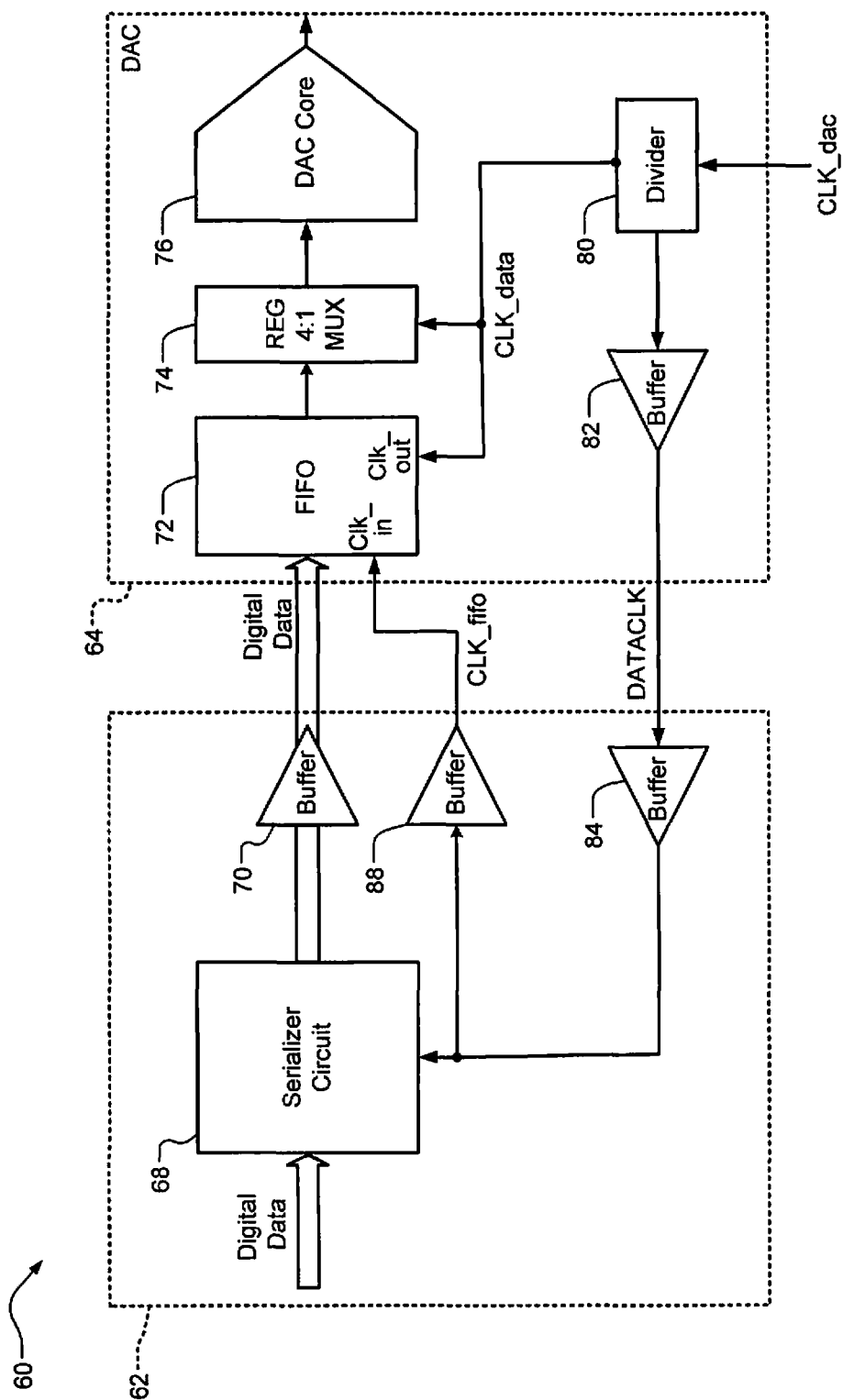
FIG. 3 is a functional block diagram of another exemplary data interface for a digital to analog converter according to the prior art.
Figures 4, 5:
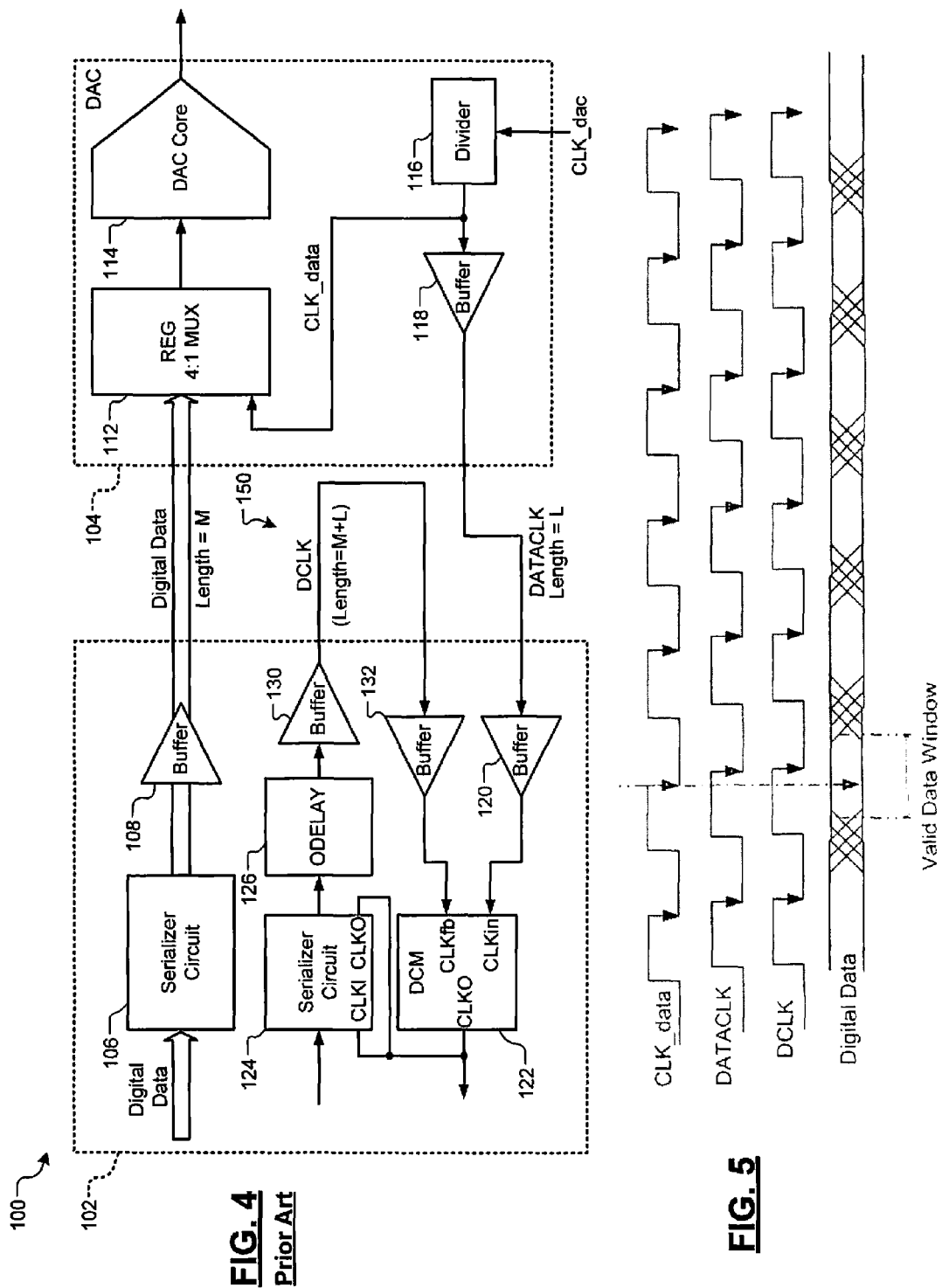
FIG. 4 is a functional block diagram of another exemplary data interface for a digital to analog converter according to the prior art.
FIG. 5 illustrates timing of clock signals for the circuit of FIG. 3.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

The present disclosure relates to a data interface between a transmitter circuit that transmits digital data to a receiver circuit. While the present disclosure will be described in the context of digital to analog converters (DACs) and analog to digital converters (ADCs), skilled artisans will appreciate that the present disclosure applies to data interfaces for other types of data transmitters and receiver circuits. At a very high level, the receiver circuit generates a clock signal that is used by the transmitter circuit to send data. The transmitter circuit generates a SYNC signal that is used by a delay lock loop circuit associated with the receiver circuit to adjust the clock signal.

In some implementations, the data interface according to the present disclosure uses the delay locked loop (DLL) circuit to synchronize a CLK_data signal and a digital data signal. The data interface reduces the impact of the DATACLK signal and digital data jitter, temperature changes, semiconductor manufacturing process variations and power supply variations. The data interface maximizes a valid data window, relaxes speed grade requirements on the FPGA, ASIC or other circuit and the internal DCM (Digital Clock Management), and eliminates the need for manual tuning. The DLL circuit forces the incoming data to track the reference clock, which is the CLK_data signal.

Operation of the data interface with the DLL circuit is accomplished in part by using an internal DAC data latch clock as a reference clock, by outputting a timing adjustable data clock to the transmitter circuit as the incoming data clock, by accepting a pseudo random bit sequence (a SYNC signal) with timing that is the same as DAC digital data, and by locking the SYNC signal to the DLL reference clock, which is the same clock as the DAC data latch clock.

The data interface according to the present disclosure also tends to relax requirements on the transmitter circuit for several reasons. Timing margin consumed by a large skew of the transmitter circuit is partially compensated by the DAC DLL circuit due to the low jitter performance. The data interface according to the present disclosure can adjust the timing of the digital data from circuit against the DAC data latch clock such that the digital data can be latched at the desired timing point regardless of variations due to PVT. As a result, the data interface according to the present disclosure can be used in high speed DACs.

Figure 6A:
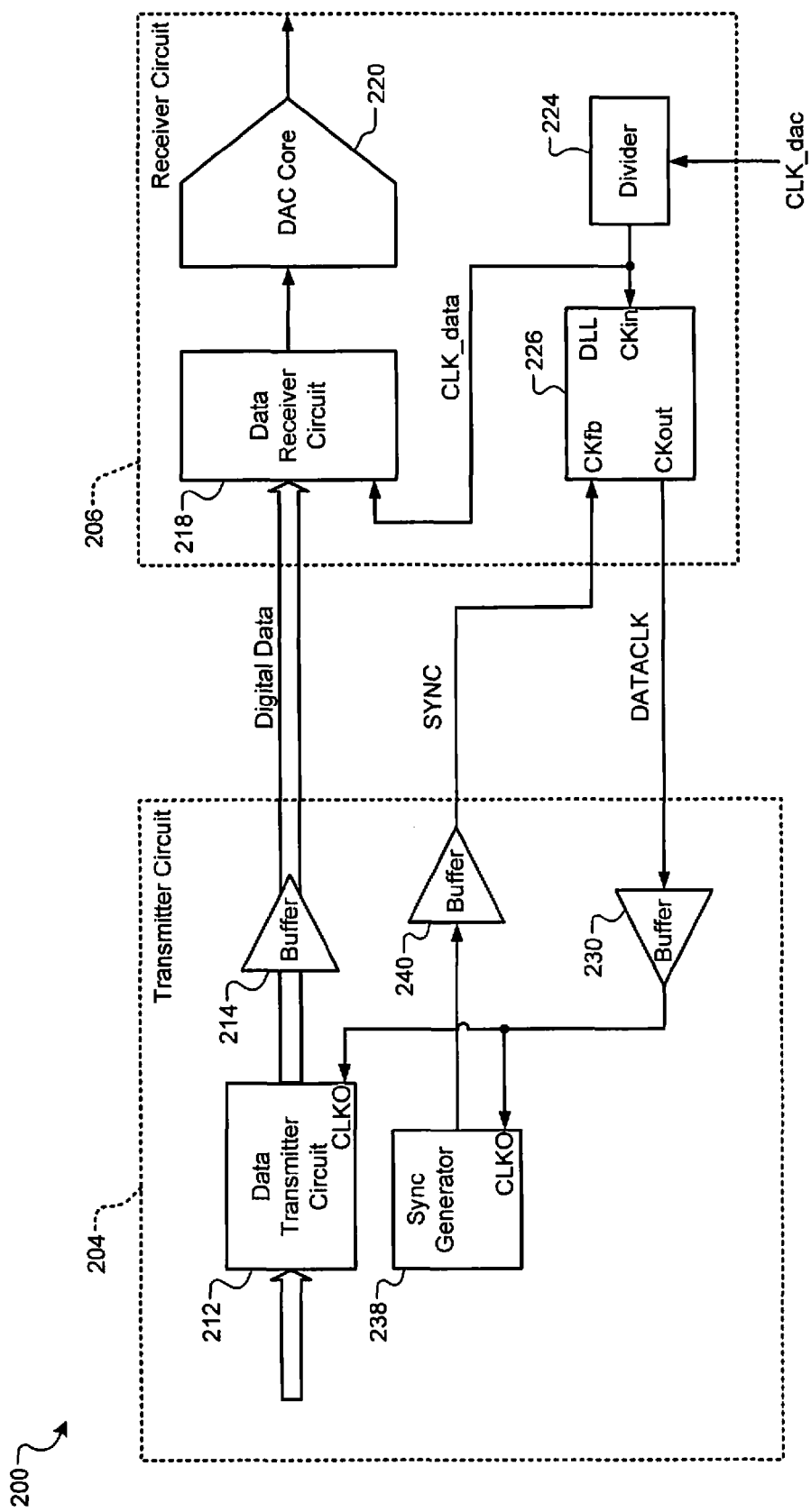
FIGS. 6A and 6B are functional block diagrams of exemplary data interfaces for a digital to analog converter according to the present disclosure.
Figure 6B:
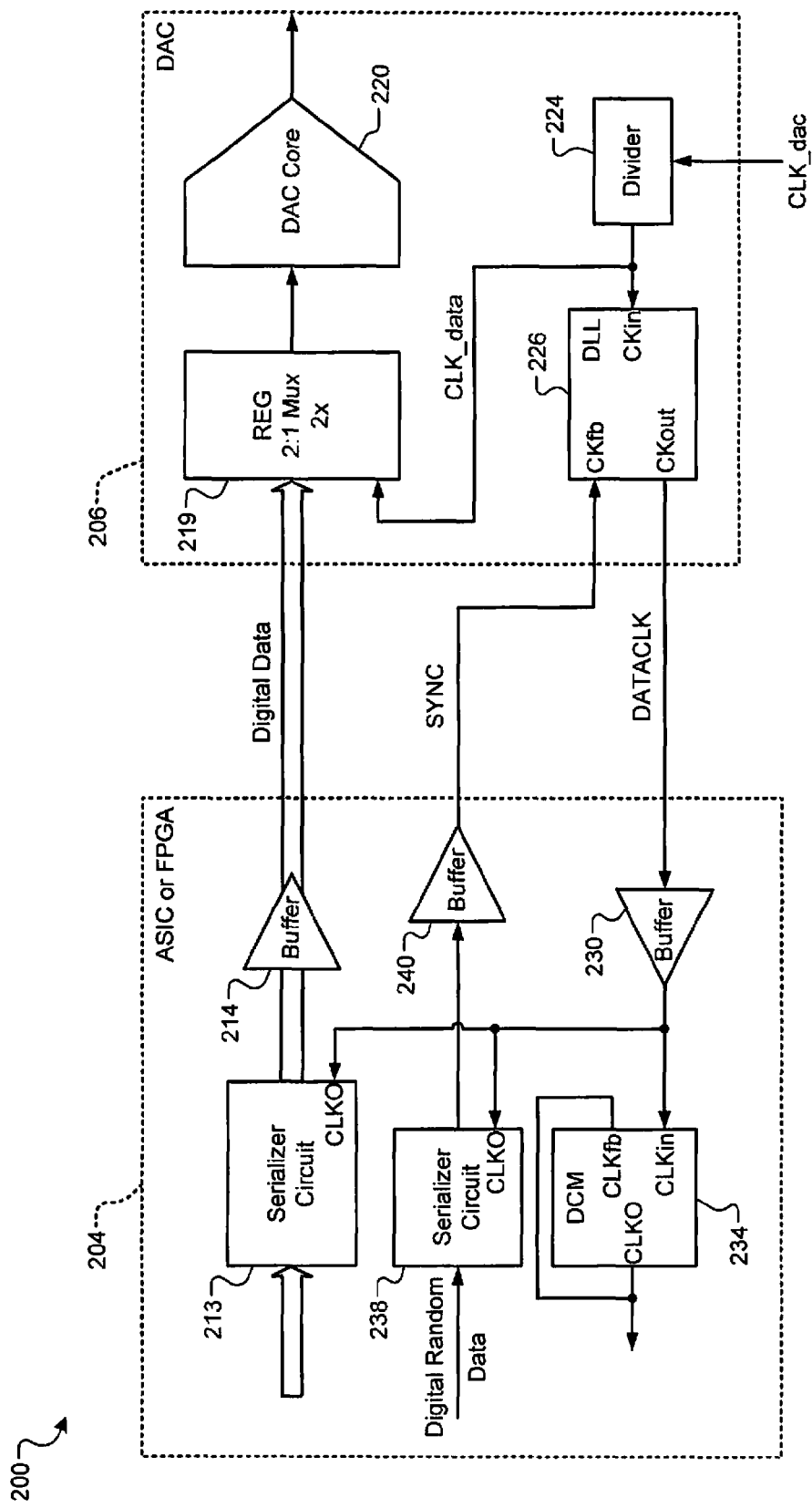
Figure 7:
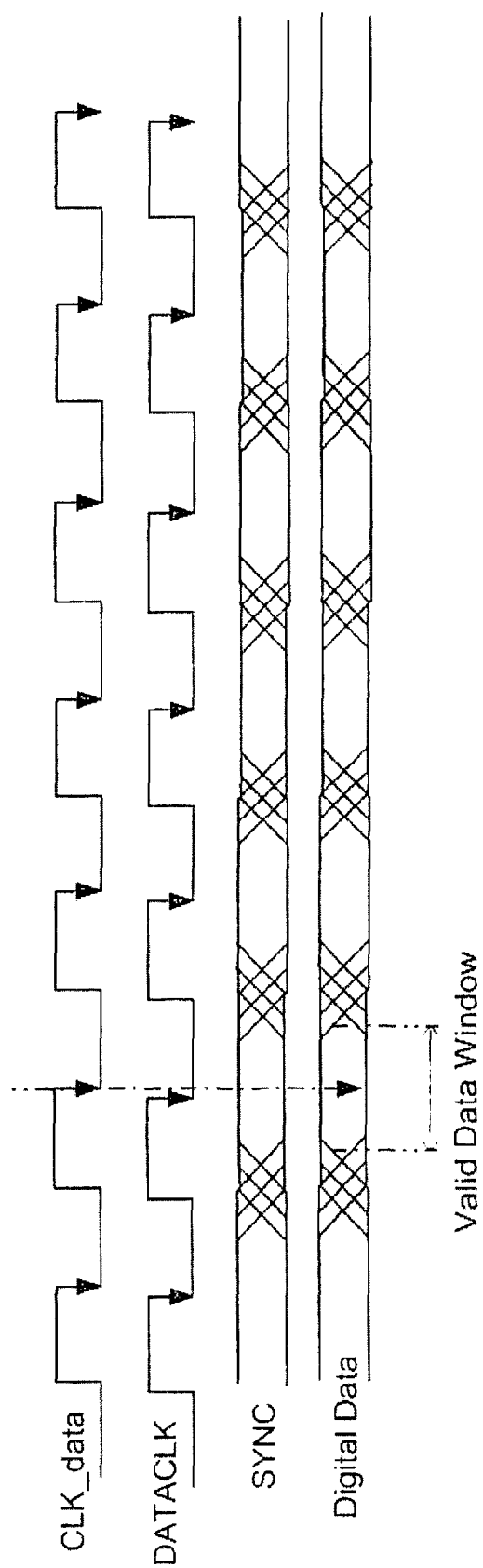
FIG. 7 illustrates timing of clock signals for the circuit of FIG. 6.

Referring now to FIGS. 6A, 6B and 7, a system 200 includes a transmitter circuit 204 and a receiver circuit 206. The transmitter circuit 204 may comprise a FPGA, ASIC or other type of circuit. In FIG. 6A, the transmitter circuit 204 may include a data transmitter circuit 212 that outputs digital data via a buffer 214. A data receiver circuit 218 of the receiver circuit 206 receives the digital data. For example only, in FIG. 6B the data transmitter circuit 212 may comprise a serializer circuit 213 that outputs the digital data, although other circuits may be used. In FIG. 6B, the data receiver circuit 218 may comprise a multiplexer 219, although other circuits may be used.

Referring back to FIG. 6A, the data receiver circuit 218 receives the digital data and a clock data signal (CLK_data). The transmitter and receiver circuits 204 and 206 may be mounted on a printed circuit board (PCB) (not shown) including traces providing interconnection and/or packaged and connected together using interconnections (not shown). An output of the data receiver circuit 218 is transmitted to a DAC core 220. The DAC core 220 further includes a clock divider circuit 224 that receives a DAC clock signal (CLK_dac). An output of the clock divider circuit 224 supplies the CLK_data signal to the data receiver circuit 218 and a delay locked loop (DLL) circuit 226.

The DLL circuit 226 outputs a DATACLK signal to the transmitter circuit 204 and receives a SYNC signal from the transmitter circuit 204. The DATACLK signal is transmitted to a buffer 230. The buffer 230 outputs the DATACLK signal to a sync generator 238 and the data transmitter circuit 212. In FIG. 6B, the DATACLK signal may also be output to a DCM circuit 234. In FIG. 6A, a sync generator 238 outputs a digital pseudo random bit or a periodic signal to a buffer 240. The buffer 240 outputs a buffered digital pseudo random data bit as the SYNC signal to the DLL circuit 226.

In use, the internal DAC data clock, the CLK_data signal is used in a different manner. According to the present disclosure, the CLK_data signal is transmitted to the transmitter circuit 204 as the DATACLK signal. The relationship between the internal DAC clock, the CLK_data signal, and the DATACLK signal is managed by DLL circuit 226 of the receiver circuit 206. The DLL circuit 226 monitors the SYNC signal such that the DATACLK signal is compensated for delay. The delay compensation on the DATACLK signal aligns the incoming data (in the SYNC signal) to the CLK_data signal. Exemplary CLK_data, DATACLK and SYNC signals and a valid data window are shown in FIG. 7.

The DLL circuit 226 of the receiver circuit 206 uses the CLK_data signal as a reference clock signal and the SYNC signal as a feedback signal. The DLL circuit 226 outputs the DATACLK signal with timing delay needed for proper alignment of the CLK_data signal and the SYNC signal alignment.

The delays that the DLL circuit 226 needs to compensate include the delay introduced by PCB routing on the DATACLK signal lines, the delay introduced inside the transmitter circuit 204, and the delay introduced in the SYNC signal line. All these external circuits (DATACLK signal lines, SYNC signal line and delay inside the transmitter circuit 204) are part of the delay locked loop. Since the delays from the transmitter circuit 204 are part of the delay locked loop, the DLL circuit 226 will compensate for PVT delay variations. The delays outside of the receiver circuit 206 are typically not well defined and depend on particular details of the transmitter circuit 204 and PCB or packaging design. In some implementations, the DLL circuit 226 may have a relatively large tracking range.

Figure 8A:
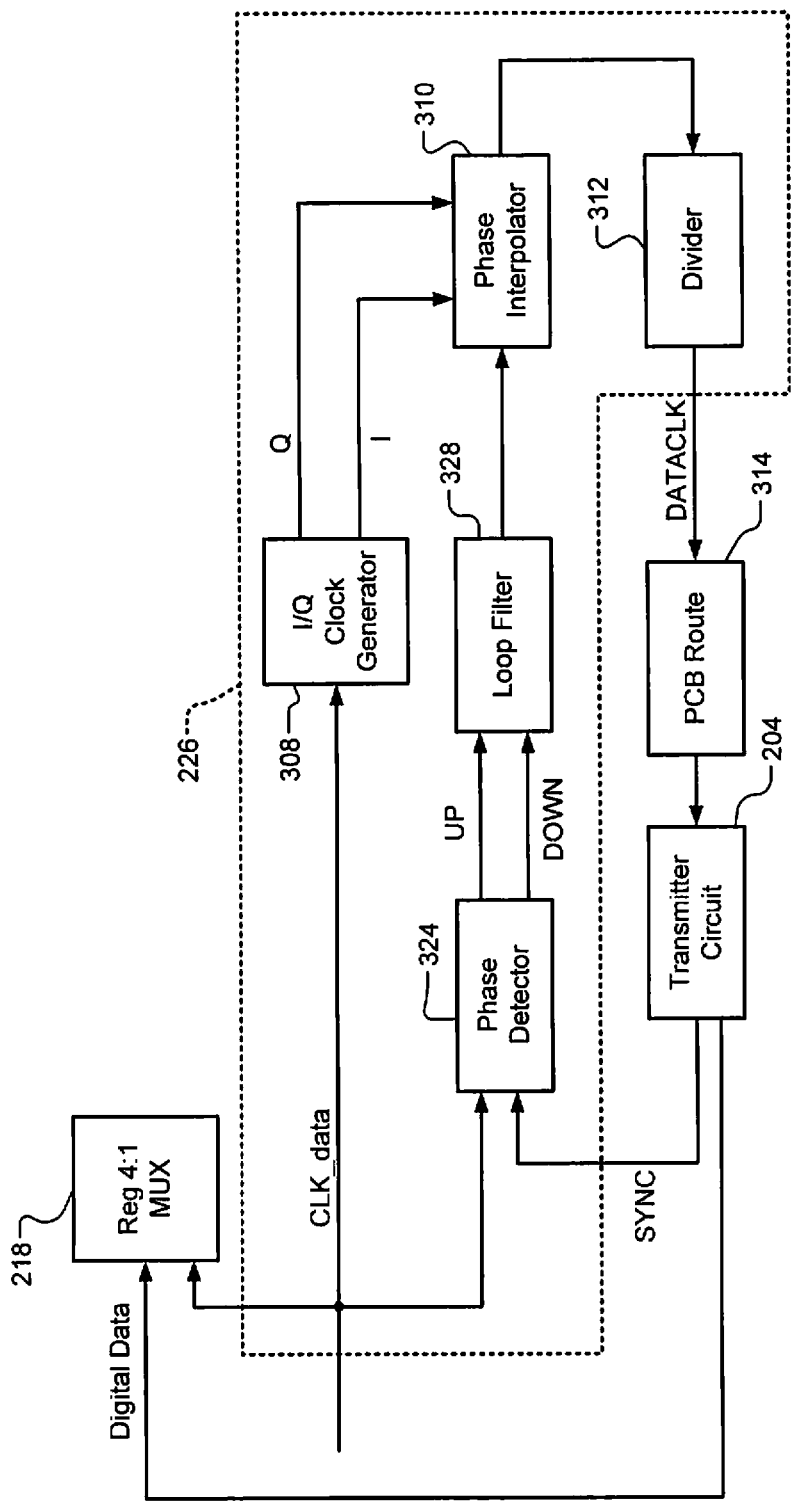
FIGS. 8A and 8B are functional block diagrams of exemplary delay locked loop circuits.

Referring now to FIG. 8A, an exemplary implementation of the DLL circuit 226 is shown. The DLL circuit 226 includes an in-phase/quadrature (I/Q) clock generator 308 that receives the CLK_data signal and outputs I and Q signals to a phase interpolator 310. The DLL circuit 226 also includes a phase detector 324 that receives the CLK_data signal and the SYNC signal. The phase detector 324 generates up and down signals based on a relationship between the CLK_data signal and the SYNC signal. In some implementations, the phase detector 324 includes an Alexander phase detector, although other types of phase detectors can be used. The up and down signals are output to a loop filter 328. An output of the loop filter 328 is transmitted to the phase interpolator 310. An output of the phase interpolator 310 is output to a divider circuit 312, which generates the DATACLK signal.

As can be appreciated, other types of DLL circuits may be used. In other words, the DLL circuit ensures that the synchronization clock (the DATACLK signal) sent to the transmitter circuit 204 is delay adjusted to align the incoming digital data from the transmitter circuit 204 with the reference clock signal, the CLK_data signal, of the DLL circuit 226.

Figure 8B:
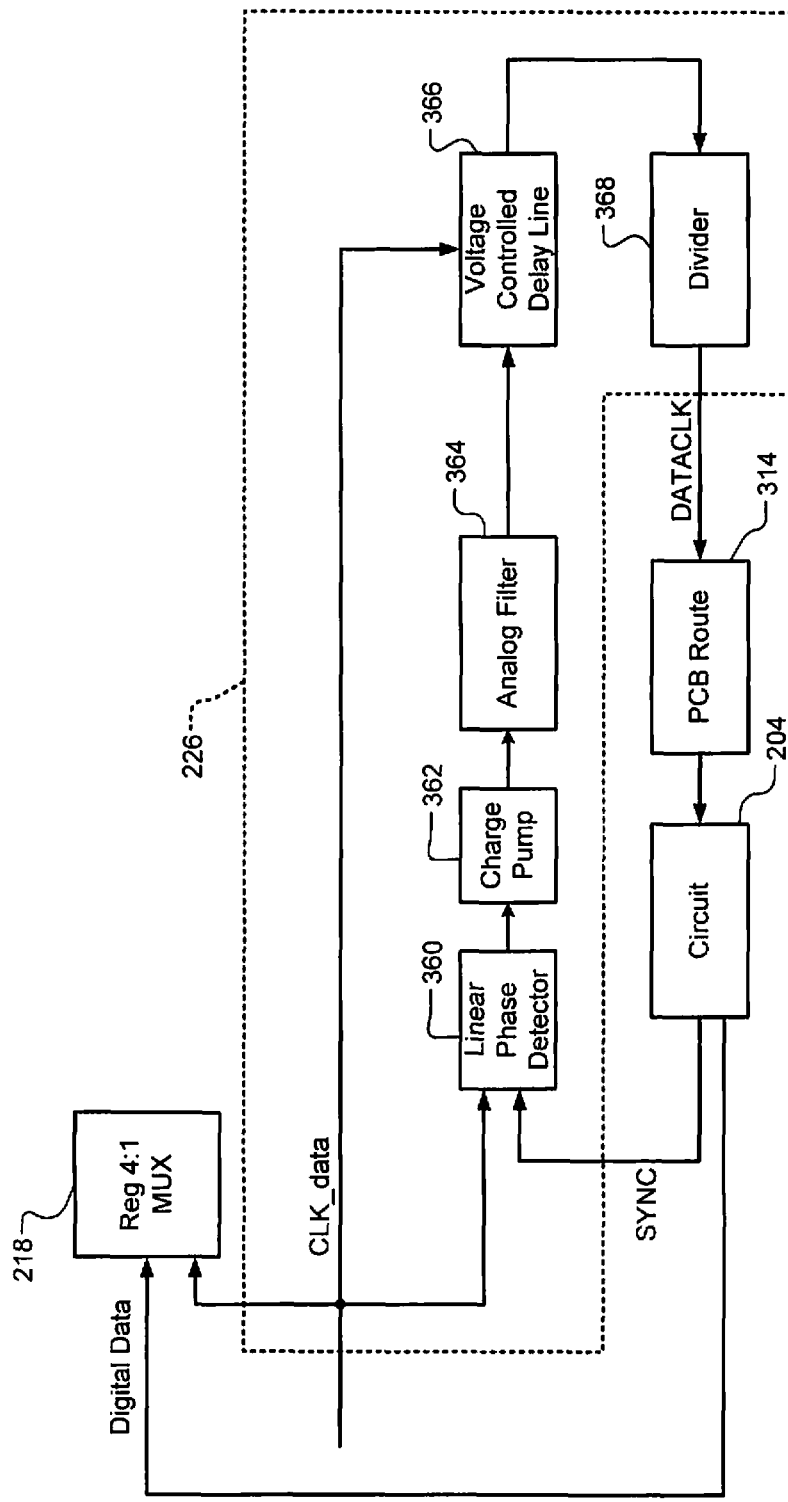

Referring now to FIG. 8B, when the sync signal is a periodic signal, a linear phase detector 360, a charge pump 362, an analog filter 364, a voltage controlled delay line 366 and a divider 368 may be used to adjust the phase.

Referring back to FIG. 8A, the CLK_data signal is used to latch the digital data from the transmitter circuit 204 into the data receiver circuit 218. The CLK_data signal also acts as the reference clock for the DLL circuit 226. The CLK_data signal feeds the phase detector 324. The DLL includes the phase detector 324, the loop filter 328, the phase interpolator 310 with I/Q clock generator 308, a divider circuit 312, external PCB routing 314, and the transmitter circuit 204. The DLL is closed by feeding back the SYNC signal from the transmitter circuit 204 into another input of the phase detector 324.

The divider circuit 312 may provide the option of selecting a lower speed for the transmitter circuit 204, which may lower cost. The SYNC signal may be generated inside the transmitter circuit 204 the same way as all the other digital data bits. Thus, the timing relationship between the SYNC signal and the CLK_data signal will be the same as the timing relationship between the digital data and the CLK_data signal. If the DLL can align the SYNC signal with required timing to the CLK_data signal, the digital data will be aligned to the CLK_data signal the same way as the SYNC signal.

The DLL uses the CLK_data signal as the reference clock into one input of the phase detector 324. The phase detector 324 determines the phase difference between the CLK_data signal and the SYNC signal. A phase error is then filtered by the loop filter 328. Based on the phase error, the phase interpolator 310 provides a delay required to make the DATACLK phase change such that the SYNC signal (input to the phase detector 324) is aligned to the CLK_data signal.

The DLL includes the phase detector 324, the loop filter 328 and the phase interpolator 310 arranged in the receiver circuit 206. The DLL also includes the external PCB routing and the transmitter circuit 204 as part of the DLL. With the external PCB routing and the circuit as part of the DLL, the delay variation of the transmitter circuit 204 is compensated by the DLL over PVT of the transmitter circuit 204.

The SYNC signal can be a pseudo random bit to spread digital noise over a broad spectrum to avoid introducing any fixed pattern spurious signals. The SYNC signal can also use a digital data bit as the feedback to the phase detector. Alternately, the SYNC signal can be a periodic signal.

Figure 9:
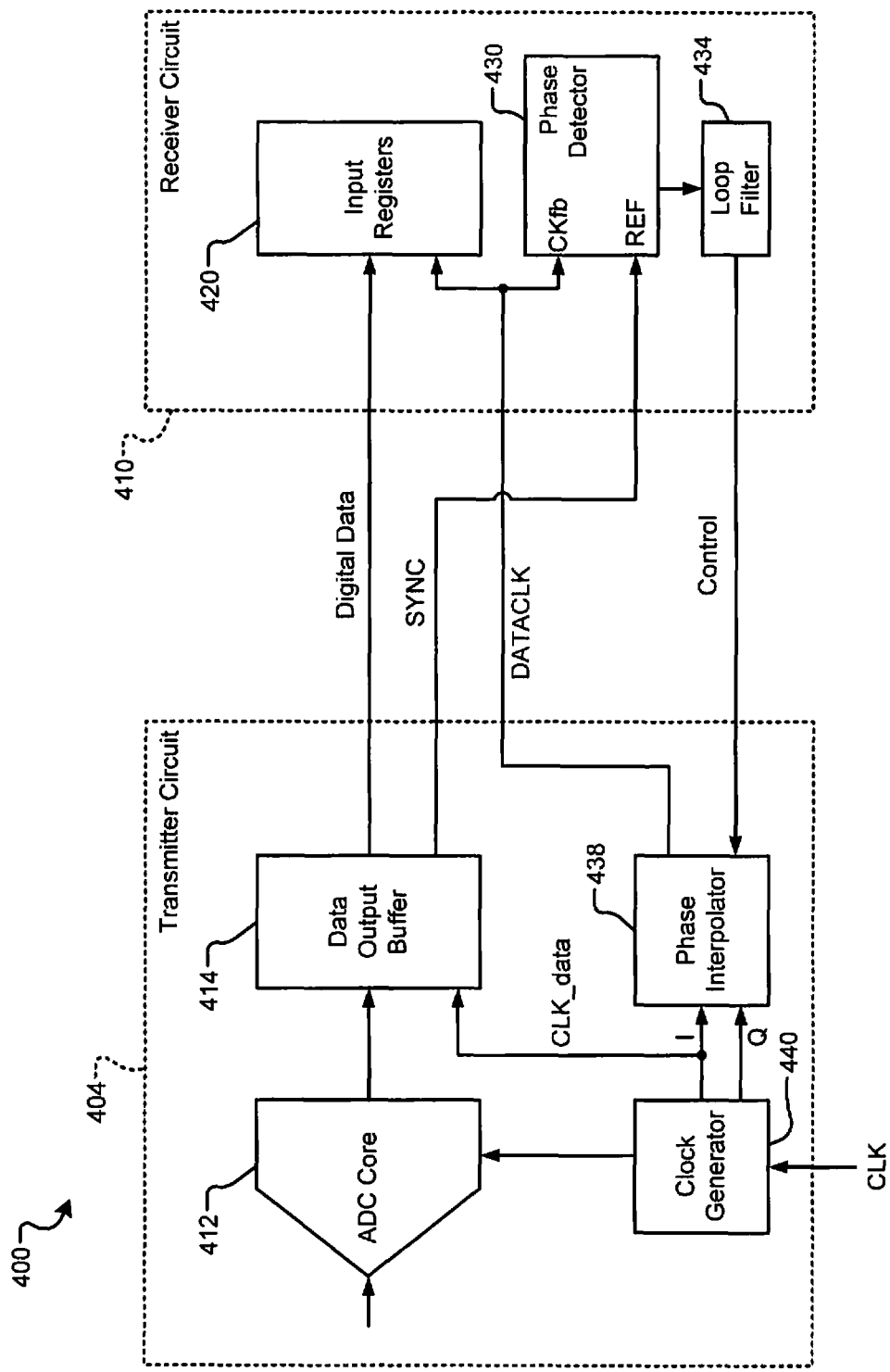
FIG. 9 is a functional block diagram of a data interface for a analog to digital converter according to the present disclosure.

The data interface according to the present disclosure can also be applied to a data interface between a high-speed ADC and an FPGA, ASIC or other circuit. Referring now to FIG. 9, another implementation of a data interface is shown. A transmitter circuit 400 includes an analog to digital converter (ADC) 404 and a receiver circuit 410 such as a FPGA, ASIC or other circuit. The ADC 404 includes an ADC core 412 that outputs a digital data signal to input registers 420 of the receiver circuit 410 via a data output buffer 414. The receiver circuit 410 includes a phase detector 430. The input registers 420 and the phase detector 430 receive a DATACLK signal from the ADC 404.

The data output buffer 414 also generates digital random data that is input to the phase detector 430. The phase detector 430 outputs a control signal to a phase interpolator 438 of the ADC 404 via a loop filter 434 of the circuit 410. The transmitter circuit 404 further includes a clock generator 440 that generates the CLK_data signal for the ADC core 412, the data output buffer 414 and the phase interpolator 438 along with I/Q clock signals. The phase interpolator 438 generates and outputs the DATACLK signal to the phase detector 430 and the input registers 420.

In general, a DLL circuit can be implemented inside the receiver circuit 410, where the DATACLK signal is sent from the transmitter circuit 404 to the receiver circuit 410. The DLL circuit can adjust a phase of the DATACLK to provide a latching clock inside the receiver circuit 410 for latching the data into the receiver circuit 410. A SYNC signal such as random data bit periodic signal can be sent from by the transmitter circuit 404 as a reference.

In general, low jitter DLLs are usually implemented as an analog circuits. The phase interpolator 438 is implemented by the transmitter circuit 404 and the phase detector 430 and the loop filter 434 are implemented by the receiver circuit 410. The DLL circuit uses the digital random data bit (or a data bit) as a reference and the DATACLK signal as a feedback clock to the phase detector 430 and the input registers 420. The DLL automatically adjusts the CLK_data signal through the loop-controlled phase interpolator 438 such that the DATACLK signal to the DLL loop and FPGA input registers is aligned to the ADC digital random data.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system comprising:
  a first circuit comprising:
    a data transmitter circuit that transmits digital data based on a first clock signal; and
    a sync generator that outputs a sync signal based on the first clock signal; and
  a digital to analog converter circuit comprising:
    a data receiver circuit that latches the digital data based on a second clock signal;
    a digital to analog converter core that receives an output of the data receiver circuit; and
    a delay locked loop circuit that determines a delay based on the second clock signal and the sync signal and that outputs the first clock signal to the first circuit based on the second clock signal and the delay,
    wherein the delay locked loop circuit comprises:
      an in-phase/quadrature (I/Q) clock generator that receives the second clock signal and that generates I and Q signals;
      a phase detector that receives the sync signal and the second clock signal and that generates up and down signals, wherein the sync signal comprises a random bit; and
      a loop filter that receives the up and down signals;
      a phase interpolator that generates a fourth clock signal based on the I and Q signals and an output of the loop filter; and
      a clock divider that receives the fourth clock signal and that outputs the first clock signal.

2. The system of claim 1 further comprising a second clock divider that receives a third clock signal and that outputs the second clock signal.

3. A system comprising:
  a first circuit comprising:
    a data transmitter circuit that transmits digital data based on a first clock signal; and
    a sync generator that outputs a sync signal based on the first clock signal; and
  a digital to analog converter circuit comprising:
    a data receiver circuit that latches the digital data based on a second clock signal;

a digital to analog converter core that receives an output of the data receiver circuit; and a delay locked loop circuit that determines a delay based on the second clock signal and the sync signal and that outputs the first clock signal to the first circuit based on the second clock signal and the delay, wherein the delay locked loop circuit comprises:
a linear phase detector that receives the sync signal and the second clock, wherein the sync signal comprises a periodic signal;
a charge pump that communicates with an output of the linear phase detector;
a filter that receives an output of the charge pump;
a voltage controlled delay line that generates a fourth clock signal based on the second clock and an output of the filter; and
a clock divider that receives the fourth clock signal and that outputs the first clock signal.

4. The system of claim 1 wherein:
the first circuit is implemented as a first integrated circuit;
the receiver circuit is implemented as a second integrated circuit; and
a printed circuit board (PCB), wherein the first integrated circuit and the second integrated circuit are mounted on the PCB in a spaced relationship and connected by traces.

5. The system of claim 1 wherein the first circuit comprises one of an Application Specific Integrated Circuit (ASIC) and a Field Programmable Gate Array (FPGA).

6. The system of claim 1 wherein the data transmitter circuit comprises a serializer and the data receiver circuit comprises a multiplexer.

7. A system comprising:
a transmitter circuit comprising:
a data transmitter circuit that outputs digital data based on a first clock signal; and
a sync generator that outputs a sync signal based on the first clock signal; and
a receiver circuit comprising:
a data receiver circuit that latches the digital data based on a second clock signal; and
a delay locked loop circuit that determines a delay based on a phase difference between the second clock signal and the sync signal and that outputs the first clock signal to a first circuit based on the second clock signal and the delay,
wherein the delay locked loop circuit comprises:
an in-phase/quadrature (I/Q) clock generator that receives the second clock signal and that generates I and Q signals;
a phase detector that receives the sync signal and the second clock signal and that generates up and down signals, wherein the sync signal comprises a random bit; and
a loop filter that receives the up and down signals;
a phase interpolator that generates a fourth clock signal based on the I and Q signals and an output of the loop filter; and
a clock divider that receives the fourth clock signal and that outputs the first clock signal.

8. The system of claim 7 further comprising a second clock divider that receives a third clock signal and that outputs the second clock signal.

9. A system comprising:
a transmitter circuit comprising:
a data transmitter circuit that outputs digital data based on a first clock signal; and
a sync generator that outputs a sync signal based on the first clock signal; and
a receiver circuit comprising:
a data receiver circuit that latches the digital data based on a second clock signal; and
a delay locked loop circuit that determines a delay based on a phase difference between the second clock signal and the sync signal and that outputs the first clock signal to a first circuit based on the second clock signal and the delay,
wherein the delay locked loop circuit comprises:
a linear phase detector that receives the sync signal and the second clock, wherein the sync signal comprises a periodic signal;
a charge pump that communicates with an output of the linear phase detector; and
a filter that receives an output of the charge pump;
a voltage controlled delay line that generates a fourth clock signal based on the second clock and an output of the filter; and
a clock divider that receives the fourth clock signal and that outputs the first clock signal.

10. The system of claim 7 wherein:
the transmitter circuit is implemented as a first integrated circuit;
the receiver circuit is implemented as a second integrated circuit; and
a printed circuit board (PCB), wherein the first integrated circuit and the second integrated circuit are mounted on the PCB in a spaced relationship and connected by traces.

11. The system of claim 7 wherein the transmitter circuit comprises one of an Application Specific Integrated Circuit (ASIC) and a Field Programmable Gate Array (FPGA).

12. The system of claim 7 further comprising:
a digital to analog converter (DAC) core,
wherein the data transmitter circuit comprises a serializer and the data receiver circuit comprises a multiplexer, and
wherein the DAC core receives an output of the data receiver.

13. The system of claim 3 further comprising a second clock divider that receives a third clock signal and that outputs the second clock signal.

14. The system of claim 3 wherein:
the first circuit is implemented as a first integrated circuit;
the receiver circuit is implemented as a second integrated circuit; and
a printed circuit board (PCB), wherein the first integrated circuit and the second integrated circuit are mounted on the PCB in a spaced relationship and connected by traces.

15. The system of claim 3 wherein the first circuit comprises one of an Application Specific Integrated Circuit (ASIC) and a Field Programmable Gate Array (FPGA).

16. The system of claim 3 wherein the data transmitter circuit comprises a serializer and the data receiver circuit comprises a multiplexer.

17. The system of claim 9 further comprising a second clock divider that receives a third clock signal and that outputs the second clock signal.

18. The system of claim 9 wherein:
the transmitter circuit is implemented as a first integrated circuit;
the receiver circuit is implemented as a second integrated circuit; and a printed circuit board (PCB), wherein the first integrated circuit and the second integrated circuit are mounted on the PCB in a spaced relationship and connected by traces.

19. The system of claim 9 wherein the transmitter circuit comprises one of an Application Specific Integrated Circuit (ASIC) and a Field Programmable Gate Array (FPGA).

20. The system of claim 9 further comprising:
a digital to analog converter (DAC) core,
wherein the data transmitter circuit comprises a serializer and the data receiver circuit comprises a multiplexer, and
wherein the DAC core receives an output of the data receiver.

\* \* \* \* \*

UNITED STATES PATENT AND TRADEMARK OFFICE
CERTIFICATE OF CORRECTION

PATENT NO. : 8,488,657 B2  
APPLICATION NO. : 12/794152  
DATED : July 16, 2013  
INVENTOR(S) : Miaochen Wu et al.

It is certified that error appears in the above-identified patent and that said Letters Patent is hereby corrected as shown below:

On the Title Page:  
Item 57, Column 2,  
Abstract, Line 1          Delete "includes" and insert --including--

In the Drawings:  
Sheet 1 of 9, Fig. 1, Prior Art    Delete "Clk_data" and insert --CLK_data--

Signed and Sealed this  
Thirty-first Day of December, 2013

Margaret A. Focarino  
*Commissioner for Patents of the United States Patent and Trademark Office*